US012656419B2

(12) United States Patent
Ding et al.

(10) Patent No.: US 12,656,419 B2
(45) Date of Patent: Jun. 16, 2026

(54) EXTENDED CLOSURE SENSOR DESIGN FOR AN ELECTRONIC DEVICE

(71) Applicant: Google LLC, Mountain View, CA (US)

(72) Inventors: Yao Ding, San Jose, CA (US); Qi Qi, San Jose, CA (US)

(73) Assignee: Google LLC, Mountain View, CA (US)

( * ) Notice: Subject to any disclaimer, the term of this patent is extended or adjusted under 35 U.S.C. 154(b) by 201 days.

(21) Appl. No.: 18/431,518

(22) Filed: Feb. 2, 2024

(65) Prior Publication Data

US 2024/0175946 A1    May 30, 2024

Related U.S. Application Data

(60) Provisional application No. 63/626,828, filed on Jan. 30, 2024.

(51) Int. Cl.
| | |
|---|---|
| *G01R 33/07* | (2006.01) |
| *G01R 33/00* | (2006.01) |
| *H01F 7/02* | (2006.01) |
| *H05K 5/02* | (2006.01) |

(52) U.S. Cl.
CPC ........ *G01R 33/072* (2013.01); *G01R 33/0011* (2013.01); *G01R 33/0047* (2013.01); *H01F 7/0294* (2013.01); *H05K 5/0226* (2013.01)

(58) Field of Classification Search
CPC .. G01R 33/07; G01R 33/072; G01R 33/0011;

G01R 33/00; G01R 33/0047; H01F 7/02;
H01F 7/0294; H05K 5/02; H05K 5/0226;
H04R 1/10; H04R 1/1025; H04R 2460/17
See application file for complete search history.

(56) References Cited

U.S. PATENT DOCUMENTS

| | | | | |
|---|---|---|---|---|
| 2014/0103915 A1* | 4/2014 | Satz | ...................... | G01R 33/09 |
| | | | | 324/207.25 |
| 2016/0313766 A1 | 10/2016 | Raff et al. | | |
| 2017/0094399 A1* | 3/2017 | Chandramohan | ...... | A45C 11/24 |
| 2018/0115816 A1 | 4/2018 | Panecki et al. | | |
| 2019/0069066 A1 | 2/2019 | Song et al. | | |
| 2021/0337303 A1 | 10/2021 | Macomber et al. | | |

* cited by examiner

*Primary Examiner* — Son T Le
(74) *Attorney, Agent, or Firm* — Colby Nipper PLLC

(57) ABSTRACT

This disclosure describes an extended closure sensor design for an electronic device. An electronic device (300) senses, with a magnetic sensor (306), an open or a closed position of the electronic device (300). A lid magnetic field is propagated through a ferromagnetic material (304) by a lid magnet (302) when a lid (310) or similar component of the electronic device (300) is in the closed position, thereby placing the lid magnetic field incident upon the magnetic sensor (306). In the open position, the lid magnetic field is materially absent and a bias magnet (308) causes a bias magnetic field to be incident upon the magnetic sensor (306).

10 Claims, 8 Drawing Sheets

EXTENDED CLOSURE SENSOR DESIGN FOR AN ELECTRONIC DEVICE

CROSS-REFERENCE TO RELATED APPLICATION(S)

This application claims the benefit of U.S. Provisional Patent Application Ser. No. 63/626,828 filed on Jan. 30, 2024, the disclosure of which is incorporated by reference herein in its entirety.

BRIEF SUMMARY

This disclosure describes an extended closure sensor design for an electronic device. An electronic device senses, with a magnetic sensor, an open or a closed position of the electronic device. A lid magnetic field is propagated through a ferromagnetic material by a lid magnet when a lid or similar component of the electronic device is in the closed position, thereby placing the lid magnetic field incident upon the magnetic sensor. In the open position, the lid magnetic field is materially absent and a bias magnet causes a bias magnetic field to be incident upon the magnetic sensor.

BRIEF DESCRIPTION OF THE DRAWINGS

FIG. 6 illustrates multiple design configurations for a shape of a ferromagnetic material within an extended closure sensor design for an electronic device according to aspects of the disclosure.

DETAILED DESCRIPTION

Overview

Figure 1:
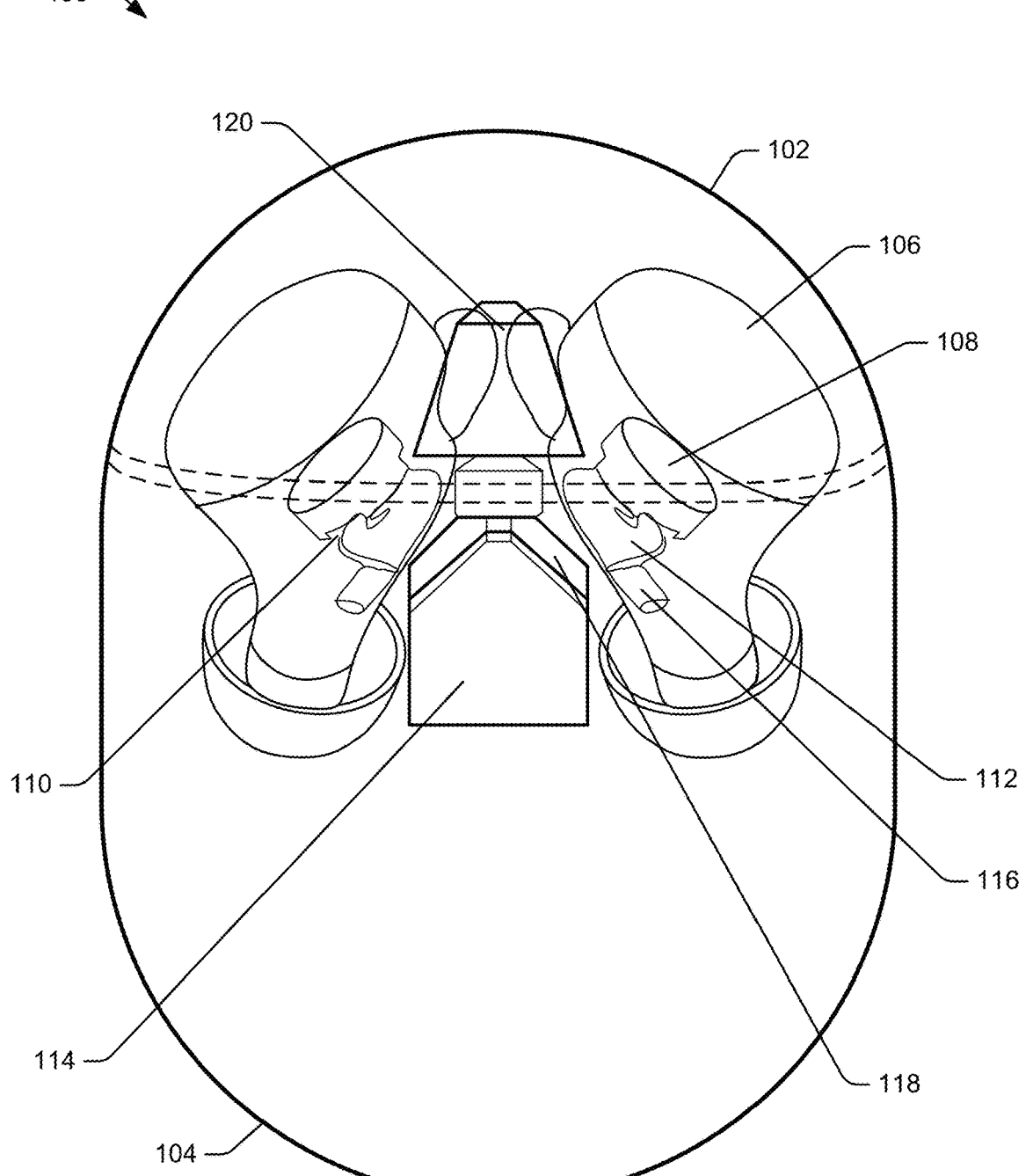
FIG. 1 illustrates a perspective view of an example electronic accessory within an example case according to aspects of the disclosure.

The technology disclosed may generally relate to an extended closure sensor design for an electronic device. An extended closure sensor design of this type may be used in a multitude of device types, including but not limited to a charging case (e.g., a charging case for earbuds, a charging case for hearing aids, etc.), a lid closure for a smart helmet, a video camera (e.g., a video camera with a pop-out screen element), a foldable smartphone, a laptop or notebook-style computer, a copier tray, etc.

The present disclosure provides for a device, the device including a first magnet and a ferromagnetic material. The ferromagnetic material may, in aspects, be positioned at a first fixed distance from the first magnet. The device may, in some examples, further include a magnetic sensor, the magnetic sensor being positioned at a second fixed distance from the first magnet and at a third fixed distance from the ferromagnetic material and configured such that a first output of the magnetic sensor is triggered by magnetic fields having a first polarity and a second output of the magnetic sensor is triggered by magnetic fields having a second polarity. In aspects, the device further includes a second magnet, the second magnet being positioned at an adjustable distance from the first magnet, the ferromagnetic material, and the magnetic sensor such that a first position of the second magnet causes a first magnetic field of the first polarity from the first magnet to be incident upon the magnetic sensor and triggers the first output, and a second position of the second magnet magnetizes the ferromagnetic material such that a second magnetic field of the second polarity from the ferromagnetic material is incident upon the magnetic sensor and triggers the second output.

In some examples, the first magnetic field or the second magnetic field being incident upon the magnetic sensor causes the magnetic sensor to be saturated. In aspects, the magnetic sensor is a Hall Effect sensor. In some examples, the ferromagnetic material is a soft iron, and the strength of the first magnet is a fraction of the strength of the second magnet, the fraction being less than one.

The device may, in some examples, further include a hinge mechanism wherein the first position of the second magnet and the second position of the second magnet are accessed by a rotation of the hinge mechanism. According to some examples, the device may further include a lid and a body, the lid and the body connected by the hinge mechanism, wherein the first magnet, the magnetic sensor, and the ferromagnetic material are situated in the body and the second magnet is situated in the lid, which may cause, according to some examples and when the lid is in a closed position, the first magnet to be positioned at a first end of the ferromagnetic material and the second magnet to be positioned at a second end of the ferromagnetic material, the first end being an opposite end to the second end. In aspects, the device may be one of a charging case for wireless earbuds, a smart helmet, a video camera, a laptop computer, a charging case for hearing aids, a copier machine, or a foldable smart phone. In some examples, when the second magnet is in the second position, a first pole of the first magnet is facing the ferromagnetic material and the magnetic sensor and a second pole of the second magnet is facing the magnetic sensor and the ferromagnetic material, the first pole and the second pole being the same polarity. In aspects, the ferromagnetic material may have one of the following shapes: a "j" shape, an "l" shape, a "c" shape, or an "s" shape.

The technology is advantageous because it provides reliable detection; for example, each state of the case may cause the magnetic sensor to be triggered by a different polarity. Configurations that cause deep saturation of the magnetic sensor may further reduce or eliminate effects of interference from other magnetic components, thereby improving detection reliability. By improving detection reliability, the technology may, for example, improve the out-of-the-box experience for wireless devices without risking violating regulations, wasting energy, etc. Improved detection reliability may also conserve energy during later use, since the case may determine whether to initiate various functions based on the state of the case and/or the state of the wireless devices. Features of the technology further provide for reducing a number of magnets required or further provide for lower strength and/or smaller magnets as well as other reduced materials usage and associated costs, which may reduce a cost of manufacturing, a footprint of the device, a weight of the device, a complexity (and, at least by proxy, a possibility of a future failure) of the device, or another benefit or a combination of several benefits.

Example Devices

FIG. 1 illustrates a case 100 for storing and/or charging an electronic accessory. As described herein, the case 100 may, for example, include a lid 102 and a housing 104. The electronic accessory, for example, may be one or more earbuds, such as an earbud 106. The earbud 106 may, in aspects, include a speaker yoke 108, which may include one or more speaker magnets 110 and a multi-injected molding (MIM) portion 112. According to some examples, the case 100 may include one or more magnets for various functions associated with the case 100, such as a housing magnet 114 to retain the earbud 106. The earbud 106 may, in aspects, couple magnetically to the housing magnet 114 via a coupling magnet 116. According to some examples, there may be additional magnets used to keep the lid 102 of the case 100 closed, such as a bottom magnet 118 and top magnet 120. Other components not pictured may also be present (e.g., one or more shunts, electronics such as a printed circuit board, one or more batteries or other charge storage devices, etc.).

Figure 2:
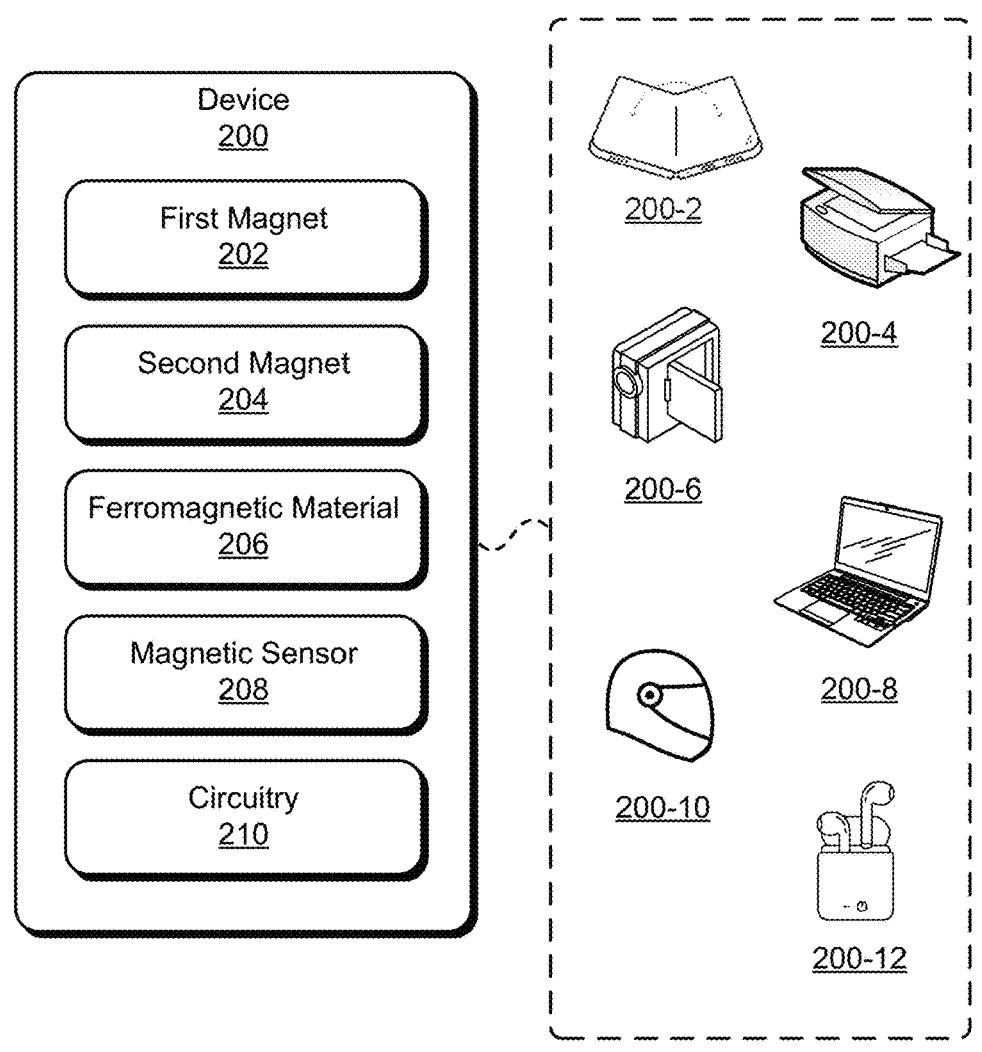
FIG. 2 illustrates an example device for an extended closure sensor design for an electronic device.

FIG. 2 illustrates an example device 200 for an extended closure sensor design for an electronic device. Examples of the type or style of the device may include a foldable smartphone 200-2, a copier with a moving lid 200-4, a video camera or other image input device with a pop-out style screen 200-6, a laptop or notebook-style computer 200-8, a smart helmet 200-10, or a charging case 200-12 for wireless earbuds, true-wireless earbuds, or hearing aids. This list of examples is meant to be illustrative and not exhaustive.

The device 200 may include, for example, a first magnet 202, a second magnet 204, a ferromagnetic material 206, a magnetic sensor 208, and circuitry 210. The magnetic sensor 208 may be, in aspects, a single-poll or multi-poll Hall Effect sensor (HES) or multiple magnetic sensors in a single-sensor configuration. The ferromagnetic material 206 may be, in aspects, a soft iron or another ferromagnetic material suitable for the application. The ferromagnetic material 206 and/or the second magnet 204 may be used to keep the device 200 in a closed position.

In addition to keeping the device 200 in a closed position, one or both of the magnets 202 and 204 may be used to trigger one or more outputs of the magnetic sensor 208. The ferromagnetic material 206 may be used to direct one or both of a first magnetic field associated with the first magnet 202 and a second magnetic field associated with the second magnet 204.

Figure 3:
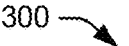
FIG. 3 illustrates an example electronic device according to aspects of the disclosure.
Figure 3:
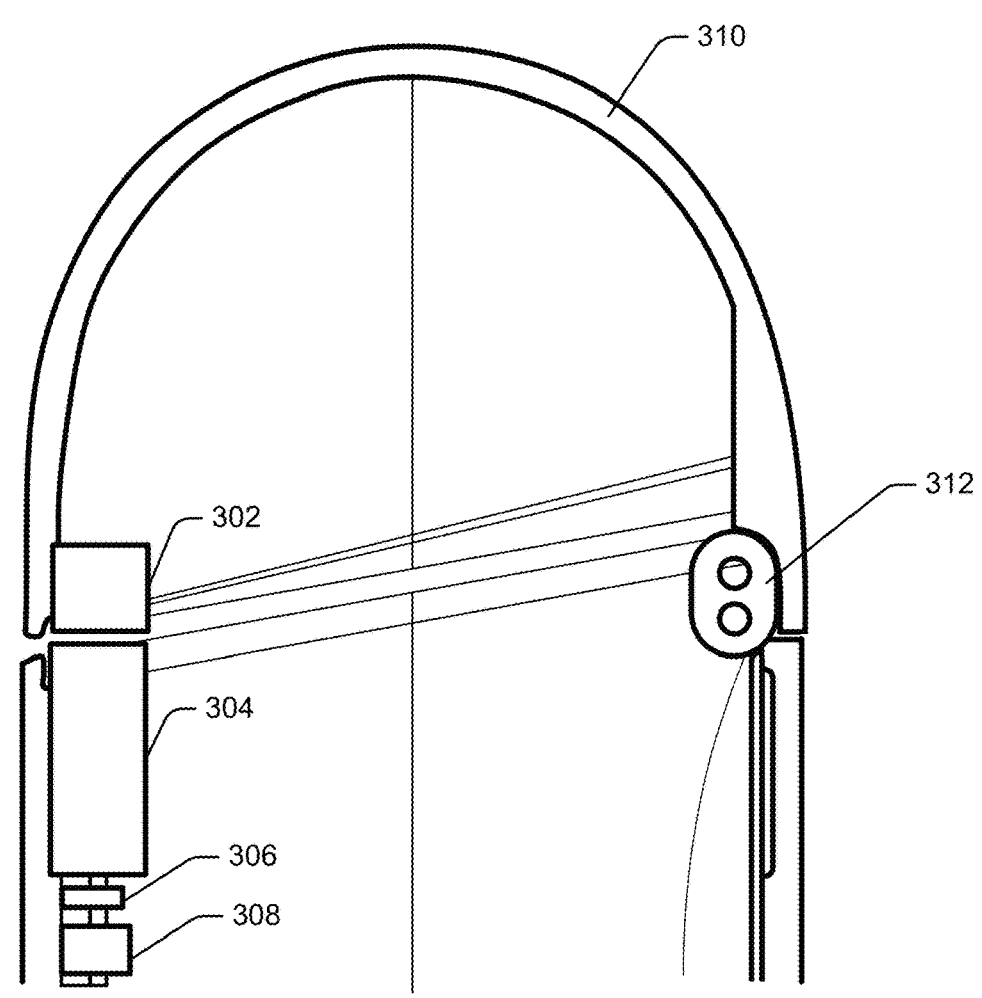

FIG. 3 illustrates an example electronic device 300 according to aspects of the disclosure. In this example, the electronic device 300 is a case for an electronic accessory, but this should not be seen as limiting. The electronic device 300 includes a lid magnet 302, a ferromagnetic material 304, a magnetic sensor 306, a bias magnet 308, a lid 310, and a hinge mechanism 312. In aspects, the lid magnet 302 may be at least partially disposed in the lid 310 such that, when the lid 310 is opened via the hinge mechanism 312, the lid magnet 302 increases a distance between the lid magnet 302 and the ferromagnetic material 304, the magnetic sensor 306, and the bias magnet 308. The ferromagnetic material 304 may, in aspects, be a fixed distance from the magnetic sensor 306 and the bias magnet 308.

When the lid 310 is in a closed position, a lid magnetic field of the lid magnet 302 may impart a coupling magnetic force on the ferromagnetic material 304. The coupling magnetic force may, in aspects, be an attractive force, thus attracting the lid magnet 302 to the ferromagnetic material 304 and working to maintain the closed position of the lid 310. When the lid 310 is in an open position, the distance between the lid magnet 302 and the ferromagnetic material 304 may be such that there is not sufficient force to compel the lid 310 to return to the closed position.

When, for example, the lid 310 is in the closed position, the lid magnetic field of the lid magnet 302 may stimulate a material magnetic field in the ferromagnetic material 304. The material magnetic field may be incident upon the magnetic sensor 306, causing a first output. The first output may be sufficient for the electronic device 300, using electronics not pictured, to classify the electronic device 300 as closed.

Alternately, in aspects, when the lid 310 is in the open position, the material magnetic field may not be present in the ferromagnetic material 304. However, in some instances the ferromagnetic material 304 may maintain the material magnetic field even after the lid magnetic field is no longer close enough or otherwise in a configuration to motivate the material magnetic field. In such instances, in aspects, the bias magnet 308 may produce a bias magnetic field configured such that the bias magnetic field is incident upon the magnetic sensor 306 and, optionally, the ferromagnetic material 304. The bias magnetic field may be configured such that the magnetic sensor 306, in the absence of the lid magnet 302 being in such a proximity as to have the lid magnetic field substantially incident upon the ferromagnetic material 304, may not have the first output or may, in the case of the magnetic sensor 306 having multiple output options or being comprised of multiple sensors, have a second output different than the first output.

Example Magnetic Field Propagation Directions

Figure 4A:
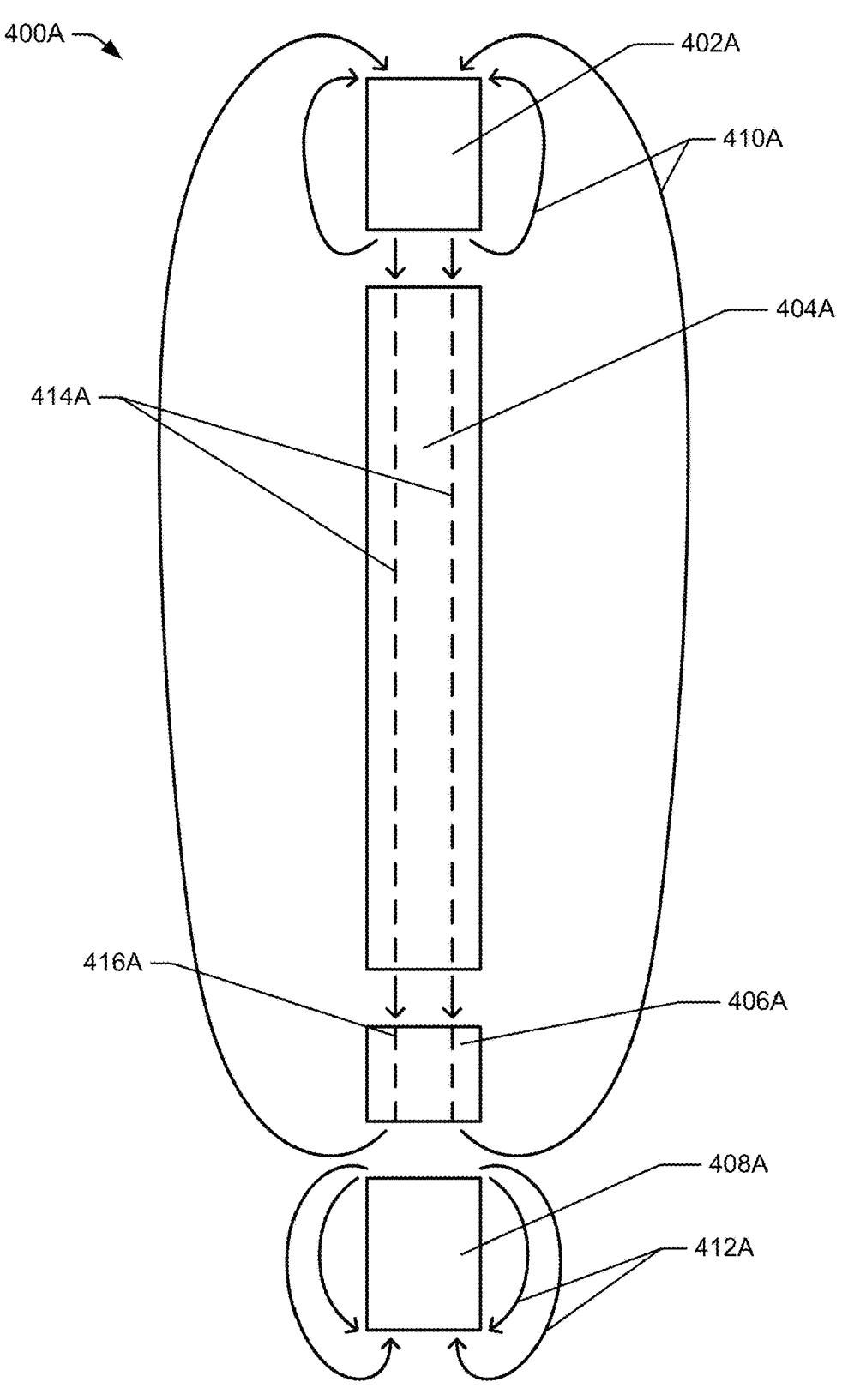
FIGS. 4A, 4B, 5A, and 5B illustrate examples of magnetic field line directions for an extended closure sensor design for an electronic device according to aspects of the disclosure.

FIG. 4A illustrates an example of magnetic field line directions for an extended closure sensor design for an electronic device 400A according to aspects of the disclosure. The electronic device 400A includes a lid magnet 402A, a ferromagnetic material 404A, a magnetic sensor 406A, and a bias magnet 408A.

The lid magnet 402A may, in aspects, produce a lid magnetic field, as indicated by lid magnetic field lines 410A. The bias magnet 408A may, in aspects, produce a bias magnetic field, as indicated by bias magnetic field lines 412A. FIG. 4A depicts the electronic device 400A in a closed position, which may entail the lid magnet 402A being a fixed distance from the ferromagnetic material 404A, the magnetic sensor 406A, and the bias magnet 408A. In some examples, when the electronic device 400A is in the closed position, the lid magnetic field (as indicated by lid magnetic field lines 410A) is incident upon the ferromagnetic material 404A such that the lid magnetic field propagates through the ferromagnetic material 404A, as indicated by material magnetic field lines 414A. The lid magnetic field may then, in aspects, be incident upon the magnetic sensor 406A, as indicated by sensor magnetic field lines 416A.

According to some examples, the lid magnet 402A and the bias magnet 408A may be selected with relative magnetic strengths such that the lid magnetic field (as indicated by the lid magnetic field lines 410A and, subsequently, the material magnetic field lines 414A and the sensor magnetic field lines 416A motivated by the lid magnetic field) is the dominant magnetic field sensed by the magnetic sensor 406A, as shown in FIG. 4. This may be characterized as the bias magnetic field having, at least at the position of the magnetic sensor 406A and when the electronic device 400A is in the closed position, a fraction of the field strength of the lid magnetic field, the fraction being less than one. It should be noted that the directionalities of the magnetic field lines 410A, 412A, 414A, and 416A may all be reversed (e.g., by reversing the polarities of both the lid magnet 402A and the bias magnet 408A), which yields the same effect.

Figure 4B:
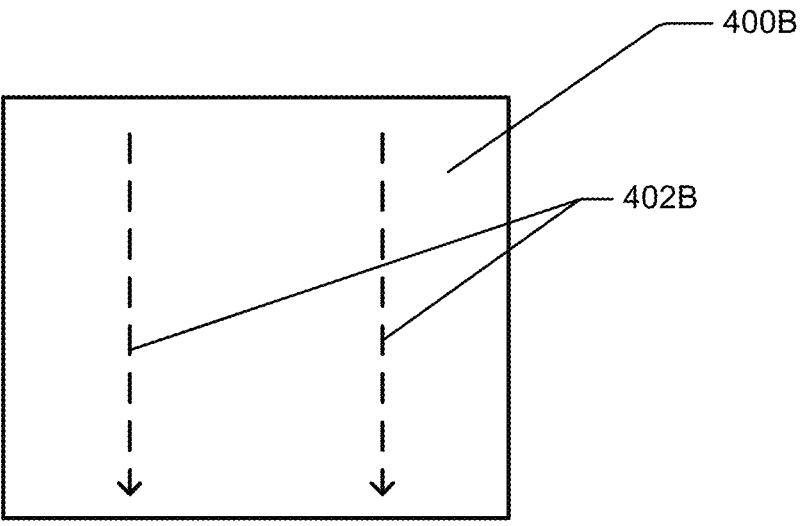

FIG. 4B shows a magnetic sensor 400B under the same or substantially the same configuration as in the magnetic sensor 406A of FIG. 4A. Sensor magnetic field lines 402B may be seen here with their directionality indicated, which indicates a "downward" direction, relative to the direction from the magnetic sensor 406A to the lid magnet 402A being defined as "upward." These sensor magnetic field lines 402B are caused by the lid magnetic field and its propagation through the ferromagnetic material 404A.

Figure 5A:
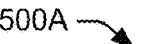

FIG. 5A illustrates an example of magnetic field line directions for an extended closure sensor design for an electronic device 500A according to aspects of the disclosure. The electronic device 500A includes a ferromagnetic material 502A, a magnetic sensor 504A, and a bias magnet 506A. Unlike in FIG. 4A, the lid magnet 402A is absent from this configuration as FIG. 5A is considering the electronic device 500A when the lid magnet 402A is in a position such that the lid magnetic field may be neglected. For example, the electronic device 500A may be in an open position such that the lid magnet 402A may be much farther away from the ferromagnetic material 502A, the magnetic sensor 504A, and the bias magnet 506A to the point that the lid magnetic field is not substantially incident upon these components of the device 500A.

The bias magnet 506A may, in aspects, produce a bias magnetic field, as indicated by bias magnetic field lines 508A. In some examples, when the electronic device 500A is in the open position, the bias magnetic field 410A may be incident upon the ferromagnetic material 502A such that the bias magnetic field 410A propagates through the ferromagnetic material 502A, as indicated by material magnetic field lines 510A. It should be noted that the propagation of the bias magnetic field 410A through the ferromagnetic material 502A (as indicated by the material magnetic field lines 510A) is not necessary, but optional.

The bias magnetic field 508A may, in the example where the electronic device 500A is in the open position, be incident upon the magnetic sensor 504A, as indicated by sensor magnetic field lines 512A. It should be noted that the directionalities of the magnetic field lines 508A, 510A, and 512A may all be reversed (e.g., by reversing the polarity of the bias magnet 506A), which yields the same effect.

Figure 5B:
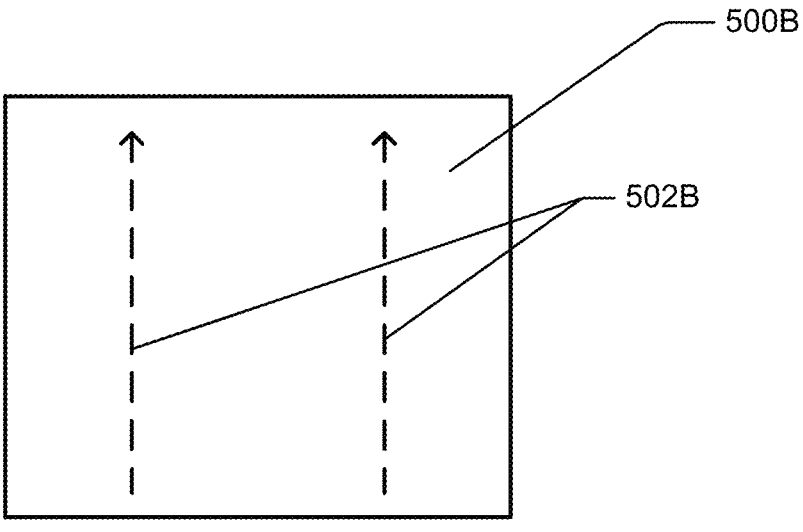

FIG. 5B shows a magnetic sensor 500B under the same or substantially the same configuration as in the magnetic sensor 504A of FIG. 5A. Sensor magnetic field lines 502B may be seen here with their directionality indicated, which indicates an "upward" direction, relative to the direction from the magnetic sensor 504A to the ferromagnetic material 502A being defined as "upward." These sensor magnetic field lines 502B are caused by the bias magnetic field 508A, with or without its propagation through the ferromagnetic material 502A as shown in FIG. 5A. FIG. 5A is of the same configuration as FIG. 4A, but without the inclusion of the lid magnet 402A and the lid magnetic field lines 410A. The directionality of a net magnetic field incident upon the magnetic sensor 500B, as indicated by the sensor magnetic field lines 502B, is in the opposite direction of the sensor magnetic field lines 402B.

The changing of the direction for the sensor magnetic field lines 402B and 502B in FIGS. 4B and 5B, respectively, show how the extended closure sensor design for an electronic device may, in aspects, handle the phenomenon of hysteresis, which is where a ferromagnetic material may retain the polarity of an applied magnetic field. Consider the ferromagnetic material 404A of FIG. 4A. It is possible that, as the lid magnet 402A is moved out of a zone of influence and the electronic device 400A, 500A is moved to the open position, the ferromagnetic material 502A retains the polarity of the applied lid magnetic field. In an electronic device without the bias magnet 506A, the material magnetic field may be incident upon the magnetic sensor 500B such that the sensor magnetic field lines 502B are in the same direction as the sensor magnetic field lines 402B. The presence of the bias magnet 506A works to overcome this effect.

In some examples, the incident lid magnetic field, as propagated through the material magnetic field, is strong enough while the electronic device 400A is in the closed position that the magnetic sensor 406A is saturated. In some examples, when the electronic device 500A is in the open position, the incident bias magnetic field is strong enough that the magnetic sensor 504A is saturated. Saturation of the magnetic sensor 406A, 504A may be desirable, in aspects, to overcome the influence of ancillary magnetic fields from other devices or device components, because the magnetic sensor 406A, 504A requires saturation in order to produce useful output(s), or for a combination of these or other reasons.

Example Configurations

Figure 6:
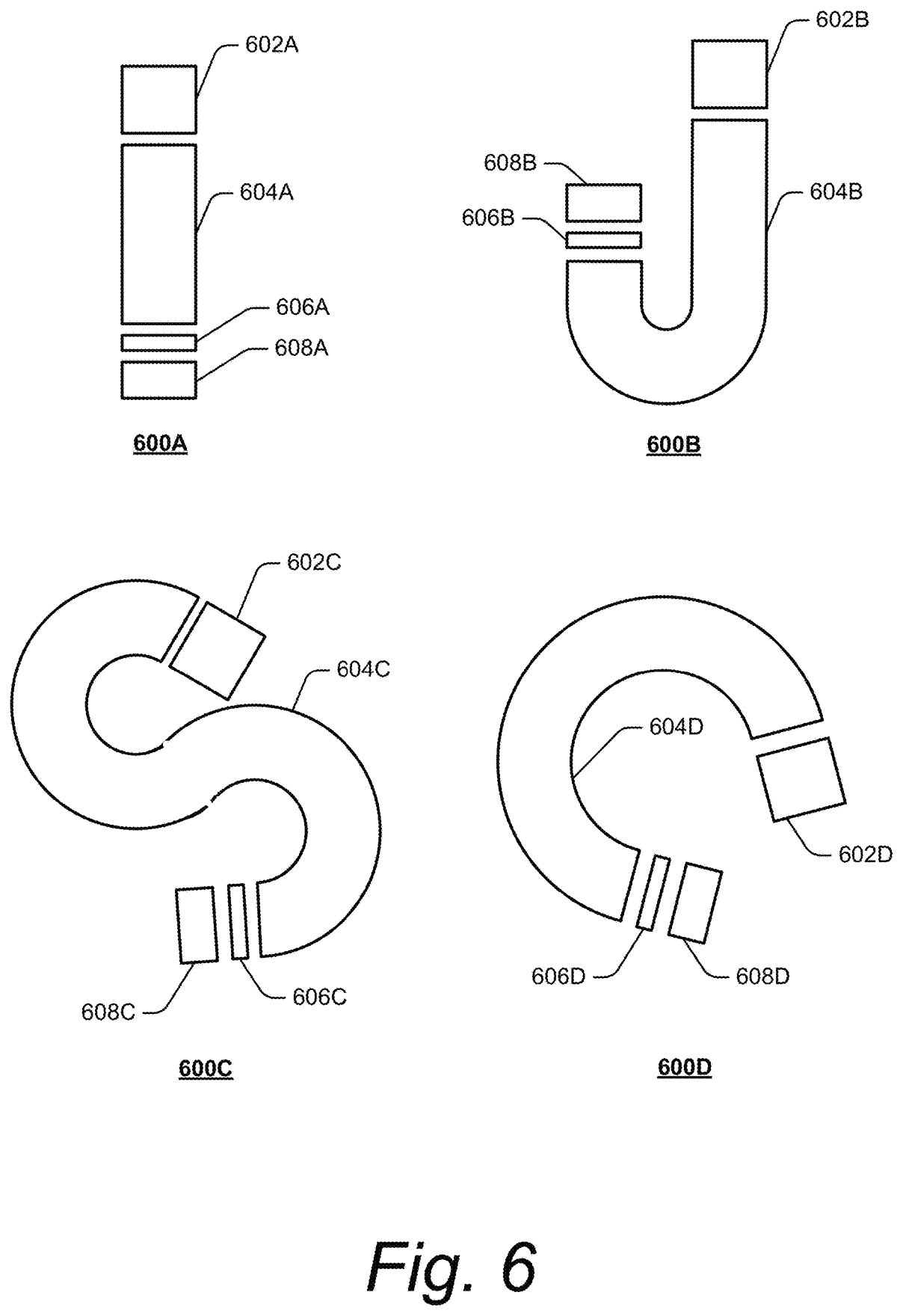

FIG. 6 illustrates multiple design configurations 600A-600D for a shape of a ferromagnetic material within an extended closure sensor design for an electronic device according to aspects of the disclosure. The configuration 600A depicts an "l" shape, so-called as the configuration is in a straight line. In such a configuration, a lid magnet 602A, a ferromagnetic material 604A, a magnetic sensor 606A, and a bias magnet 608A are all along a same axis or straight line.

The configuration 600B depicts a "j" shape, so-called as the configuration is in a line with a single bend at one end. In such a configuration, a lid magnet 602B, a ferromagnetic material 604B, a magnetic sensor 606B, and a bias magnet 608B are all along a connected path with a curve at one end. The bend is accomplished by curving the configuration of the ferromagnetic material 604B. The basic configuration of the magnetic sensor 606B and the bias magnet 608B in relation to each other is not changed from the configuration 600A. As a lid magnetic field may, in aspects, propagate through the ferromagnetic material 604B when the electronic device is in a closed position and the lid magnetic field may be materially absent when the electronic device is in an open position, the functionalities of configurations 600A and 600B are materially the same.

The configuration 600C depicts an "s" shape, so-called as the configuration is in a line with a bend at each end. In such a configuration, a lid magnet 602C, a ferromagnetic material 604C, a magnetic sensor 606C, and a bias magnet 608C are all along a connected path with a curve at each end. The bends are accomplished by curving the configuration of the ferromagnetic material 604C. The basic configuration of the magnetic sensor 606C and the bias magnet 608C in relation to each other is not changed from the configurations 600A and 600B. As the lid magnetic field may, in aspects, propagate through the ferromagnetic material 604C when the electronic device is in the closed position and the lid magnetic field may be materially absent when the electronic device is in the open position, the functionalities of configurations 600A, 600B, and 600C are materially the same.

The configuration 600D depicts a "c" shape, so-called as the configuration is in a continuous curve or semicircle shape. In such a configuration, a lid magnet 602D, a ferromagnetic material 604D, a magnetic sensor 606D, and a bias magnet 608D are all along a connected path with a single, continuous curve. The single, continuous curve is accomplished by curving the configuration of the ferromagnetic material 604D. The basic configuration of the magnetic sensor 606D and the bias magnet 608D in relation to each other is not changed from the configurations 600A, 600B, and 600C. As the lid magnetic field may, in aspects, propagate through the ferromagnetic material 604D when the electronic device is in the closed position and the lid magnetic field may be materially absent when the electronic device is in the open position, the functionalities of the configurations 600A, 600B, 600C, and 600D are materially the same.

The configurations 600A, 600B, 600C, and 600D are meant to serve as examples and are not meant to be an exhaustive list of all types of configurations. Any configuration that leaves the basic configuration of the magnetic sensors 606A, 606B, 606C, and 606D and the bias magnets 608A, 608B, 608C, and 608D, respectively, the same and allows the lid magnetic field to propagate through the ferromagnetic material 604A, 604B, 604C, and 604D will have the same functionality. A person of ordinary skill in the art may readily conjecture any number of different configurations, which will result in the same functional configuration as those outlined in FIG. 6.

CONCLUSION

While the present subject matter has been described in detail with respect to various specific example implementations thereof, each example is provided by way of explanation, not limitation of the disclosure. Those skilled in the art, upon attaining an understanding of the foregoing, can readily produce alterations to, variations of, and equivalents to such implementations. Accordingly, the subject disclosure does not preclude inclusion of such modifications, variations, and/or additions to the present subject matter as would be readily apparent to one of ordinary skill in the art. For instance, features illustrated or described as part of one implementation can be used with another implementation to yield a still further implementation. Thus, it is intended that the present disclosure cover such alterations, variations, and equivalents.

What is claimed is:

1. A device, comprising:

a first magnet;

a ferromagnetic material, the ferromagnetic material being positioned at a first fixed distance from the first magnet;

a magnetic sensor, the magnetic sensor being positioned at a second fixed distance from the first magnet and at a third fixed distance from the ferromagnetic material, the magnetic sensor configured such that a first output of the magnetic sensor is triggered by magnetic fields having a first polarity and a second output of the magnetic sensor is triggered by magnetic fields having a second polarity; and a second magnet, wherein a strength of the first magnet is a fraction of a strength of the second magnet, the fraction being less than one, the second magnet being positioned at an adjustable distance from the first magnet, the ferromagnetic material, and the magnetic sensor such that:

a first position of the second magnet causes a first magnetic field of the first polarity from the first magnet to be incident upon the magnetic sensor and trigger the first output; and a second position of the second magnet magnetizes the ferromagnetic material such that a second magnetic field of the second polarity from the ferromagnetic material is incident upon the magnetic sensor and triggers the second output.

2. The device of claim 1, wherein the first magnetic field or the second magnetic field being incident upon the magnetic sensor causes the magnetic sensor to be saturated.

3. The device of claim 1, wherein the magnetic sensor is a Hall effect sensor.

4. The device of claim 1, wherein the ferromagnetic material is a soft iron.

5. The device of claim 1, further comprising a hinge mechanism and wherein the first position of the second magnet and the second position of the second magnet are accessed by a rotation of the hinge mechanism.

6. The device of claim 5, further comprising a lid and a body, the lid and the body connected by the hinge mechanism, wherein the first magnet, the magnetic sensor, and the ferromagnetic material are situated in the body and the second magnet is situated in the lid.

7. The device of claim 6, wherein the device is one of a charging case for wireless earbuds, a smart helmet, a video camera, a laptop computer, a charging case for hearing aids, a copier machine, or a foldable smart phone.

8. The device of claim 6, wherein, when the lid is in a closed position, the first magnet is positioned at a first end of the ferromagnetic material and the second magnet is positioned at a second end of the ferromagnetic material, the first end being an opposite end to the second end.

9. The device of claim 1, wherein when the second magnet is in the second position a first pole of the first magnet is facing the ferromagnetic material and the magnetic sensor and a second pole of the second magnet is facing the magnetic sensor and the ferromagnetic material, the first pole and the second pole being the same polarity.

10. The device of claim 1, wherein the ferromagnetic material has one of the following shapes:

a "j" shape;

an "l" shape;

a "c" shape; or an "s" shape.

\* \* \* \* \*